United States Patent
Gualandri et al.

(10) Patent No.: US 7,200,047 B2
(45) Date of Patent: *Apr. 3, 2007

(54) HIGH VOLTAGE POSITIVE AND NEGATIVE TWO-PHASE DISCHARGE SYSTEM AND METHOD FOR CHANNEL ERASE IN FLASH MEMORY DEVICES

(75) Inventors: Stephen J. Gualandri, Campbell, CA (US); Theodore T. Pekny, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/080,351

(22) Filed: Mar. 14, 2005

(65) Prior Publication Data

US 2005/0201161 A1    Sep. 15, 2005

Related U.S. Application Data

(63) Continuation of application No. 10/768,573, filed on Jan. 29, 2004, now Pat. No. 6,868,016, which is a continuation of application No. 10/074,453, filed on Feb. 11, 2002, now Pat. No. 6,714,458.

(51) Int. Cl.
*G11C 16/14* (2006.01)
*G11C 16/16* (2006.01)

(52) U.S. Cl. ............... 365/185.29; 365/185.33; 365/185.25; 365/204

(58) Field of Classification Search ........... 365/185.23, 365/185.25, 185.29, 185.3, 185.31, 185.33, 365/204

See application file for complete search history.

(56) References Cited

U.S. PATENT DOCUMENTS

| | | | | |
|---|---|---|---|---|
| 5,706,241 | A * | 1/1998 | Nakamura et al. | 365/226 |
| 5,708,606 | A * | 1/1998 | Tanzawa et al. | 365/185.17 |
| 5,828,621 | A | 10/1998 | Tanzawa et al. | 365/229 |
| 5,907,506 | A | 5/1999 | Jinbo | 365/185.29 |
| 5,999,455 | A | 12/1999 | Lin et al. | 365/185.24 |
| 6,031,774 | A | 2/2000 | Chung | 365/204 |
| 6,438,032 | B1 | 8/2002 | Pekny et al. | 365/185.18 |
| 6,445,618 | B1 | 9/2002 | Atsumi et al. | 365/185.27 |
| 6,452,853 | B2 | 9/2002 | Iwahashi | 365/226 |
| 6,480,419 | B2 | 11/2002 | Lee | 365/185.18 |
| 6,512,702 | B1 | 1/2003 | Yamamura et al. | 365/185.33 |
| 6,545,914 | B2 | 4/2003 | Lee | 365/185.29 |
| 6,646,925 | B2 | 11/2003 | Kaya et al. | 365/185.29 |
| 6,707,715 | B2 * | 3/2004 | Michael et al. | 365/185.18 |
| 6,714,458 | B2 * | 3/2004 | Gualandri et al. | 365/185.29 |
| 6,868,016 | B2 * | 3/2005 | Gualandri et al. | 365/185.29 |
| 2005/0201161 | A1 * | 9/2005 | Gualandri et al. | 365/185.29 |

* cited by examiner

*Primary Examiner*—J. H. Hur
(74) *Attorney, Agent, or Firm*—Dorsey & Whitney LLP

(57) ABSTRACT

An erase discharge circuit in a flash memory is coupled to an array source and a p-well drive and receives first and second discharge signals. The erase discharge circuit operates during a discharge cycle in a first mode in response to the first discharge signal to couple the first node to the second node and to discharge voltages on the first and second nodes at a first rate. The erase discharge circuit operates in a second mode in response to the second discharge signal to couple the first node to the second node to discharge the voltages on the first and second nodes at a second rate.

20 Claims, 7 Drawing Sheets

HIGH VOLTAGE POSITIVE AND NEGATIVE TWO-PHASE DISCHARGE SYSTEM AND METHOD FOR CHANNEL ERASE IN FLASH MEMORY DEVICES

CROSS-REFERENCE TO RELATED APPLICATIONS

This application is a continuation of U.S. patent application Ser. No. 10/768,573, filed Jan. 29, 2004, and issued as U.S. Pat. No. 6,868,016, which is a continuation of U.S. patent application Ser. No. 10/074,453, filed Feb. 11, 2002, and issued as U.S. Pat. No. 6,714,458.

TECHNICAL FIELD

The present invention relates generally to integrated circuits, and more specifically to the storage of nonvolatile data in integrated circuits.

BACKGROUND OF THE INVENTION

Many battery-powered portable electronic devices, such as laptop computers, Portable Digital Assistants, digital cameras, cell phones and the like, require memory devices that provide large storage capacity and low power consumption. One type of memory device that is well-suited to use in such portable devices is flash memory, which is a type of semiconductor memory that provides relatively large and nonvolatile storage of data. The nonvolatile nature of the storage means that the flash memory does not require power to maintain the data, as will be appreciated by those skilled in the art.

A typical flash memory includes a memory-cell array having a large number of memory cells arranged in rows and columns and grouped into blocks. FIG. 1A illustrates a simplified cross-sectional view of a conventional flash memory cell 100. The flash memory cell 100 is formed by a field-effect transistor 101 including an N+ source region 102 and an N+ drain region 104 formed in an isolated p-well 106 in a semiconductor substrate (not shown). A P+ region 107 is formed in the p-well 106 and is coupled to a p-well drive PWDRV that receives a voltage to bias the p-well at a required level during various modes of operation of the memory-cell 100, as will be discussed in more detail below. A channel region 108 is defined in the p-well 106 between the source region 102 and drain region 104. In the memory-cell array containing the flash memory cell 100, the source region 102 is coupled to an array source AS, with all memory cells 100 in a given block in the flash memory being coupled to the same array source. The drain region 104 of each memory cell 100 is coupled to a bit line BL of the memory-cell array.

The memory cell 100 further includes a floating gate 110 formed on an oxide layer 112 over the channel region 108, with the floating gate being capable of holding a charge from electrons that are transferred either to or from the channel region 108 through the oxide layer 112. A control gate 114 is formed over the floating gate 110 with a dielectric layer 116 being disposed between the two gates to isolate the control gate from the floating gate. The control gate 114 of each memory cell 100 is coupled to a word line WL of the memory-cell array.

In operation, during a programming mode charge is stored on the floating gate 110 and during an erase mode charge is removed from the floating gate. The presence or absence of charge on the floating gate 110 determines a threshold voltage VT of the field effect transistor 101 so that when the word line WL is activated (i.e. applies active voltage to the control gate) the transistor either turns ON or stays OFF depending on whether charge is or isn't stored on the floating gate, as will be discussed in more detail below. In this way, the memory cell 100 stores a first logic state when the floating gate 110 stores charge and a second logic state when the floating gate does not store charge.

FIG. 1B illustrates the operation of the memory cell 100 of FIG. 1A during a write mode. To write data to the memory cell 100, which means to store a charge on the floating gate 110 and, in turn, store the corresponding logic state in the memory cell, a positive programming voltage VPP is applied through the word line WL to the control gate 114. This positive programming voltage VPP on the control gate 114 attracts electrons 120 from the p-well 106 and causes them to accumulate toward the surface of the channel region 108. During a write, a drain voltage VD is applied through the bit line BL to the drain 104, and the array source AS and p-well drive PWDRV are coupled to ground to thereby couple the source 102 and p-well 106 to ground, respectively. The value of VD depends upon the process technology, and is typically 3 to 5 volts. As the drain-to-source voltage increases, electrons 120 begin to flow through the channel 108 from source 102 to drain 104, and in the process some electrons acquire a large kinetic energy. The voltage difference between control gate 114 and the drain 104 creates an electric field through the oxide layer 116, and this electric field attracts the electrons 120. Some of the electrons 120 having enough kinetic energy to overcome the barrier presented by the oxide 112. These electrons 120 are attracted to and accumulate on the floating gate 110, which charges the floating gate. The write operation continues for a required time, and the programming voltages VPP, VD and ground applied to the word line WL, drain 104, and source 102, respectively, are thereafter removed.

The charged floating gate 110 raises the threshold voltage VT of the field effect transistor 101 above the active voltage applied on the word line WL during subsequent read operations. As a result, when the word line WL goes active during a read, the memory cell 100 does not turn ON and sense amplifiers (not shown) coupled to the bit line BL sense and amplify the current through the memory cell 100 and drive an output signal to a first logic state. Thus, in this situation, the sense amplifiers drive the output signal to the first logic state stored by the memory cell 100 that was previously written to or programmed. Note that during a write operation, a particular memory cell 100 in the memory-cell array is programmed to the first logic state, in contrast to an erase operation in which the data stored in a block of memory cells in the array are erased or programmed to a second logic state that is the complement of the first logic state, as will now be discussed in more detail.

FIG. 1C illustrates the operation of the memory cell 100 of FIG. 1B during an erase mode. During the erase mode, the memory cell 100 is erased by discharging the floating gate 110. To erase the memory cell 100, the voltage VPP, which is developed on a high voltage bus HVBUS in the flash memory containing the memory cell 100, is applied through the array source AS and p-well drive PWDRV to the source 102 and p-well 106, respectively. A negative programming voltage −VPP is applied through the word line WL to the control gate 114, and the drain 104 is floated or electrically isolated. In response to these applied voltages, electrons 120 stored on the floating gate 110 are attracted to the source 102 through the oxide layer 116 until the floating gate is discharged. The discharged floating gate 110 results in the threshold voltage VT of the transistor 101 being returned to a value below the active voltage applied on the word line WL during subsequent read operations. As a result, when the word line WL goes active during a read, the memory cell 100 turns ON and sense amplifiers (not shown) coupled to the bit line BL sense and amplify the current through the memory cell 100 and drive the output signal to the second logic state. Thus, in this situation, the sense amplifiers drive the output signal to the second logic state stored by the memory cell 100 that was previously erased and not thereafter written to or programmed. As previously mentioned, during the erase mode, all memory cells in a given block are erased and thus store the second logic state. The array sources AS of all memory cells 100 in a given block are coupled together. As will be understood by those skilled in the art, the HVBUS bus is a bus in the flash memory on which required voltages, including the voltage VPP, are developed, and when the voltage on the bus is to be applied to a component in the flash memory the component is simply coupled to the bus.

After erasing the memory cell 100 but prior to reading data from the memory cell, the voltages on the word line WL, array source AS, and p-well drive PWDRV must be discharged to approximately zero volts. Ideally, these voltages are discharged quickly so that a write or read operation may be performed as soon as possible after a block of memory cells 100 is erased. In a conventional flash memory, however, the physical structure of the memory-cell array and the memory cells 100 results in capacitive coupling between the word line WL and the p-well 106 and between the word line and the array source AS as represented by the capacitors CWP and CWA, respectively, in FIG. 1C. As a result of this capacitive coupling, the discharge of the negative voltage −VPP on the word line WL affects the rate at which the voltages VPP on the array source AS and p-well drive PWDRV discharge. The converse is also true, namely the discharge of the positive voltages VPP on the arrays source AS and p-well drive PWDRV affect the rate at which the word line WL discharges.

FIG. 2 illustrates a conventional discharge cycle and the affect of the capacitive coupling between the word line WL and the array source AS and p-well drive PWDRV. At a time T0, discharge circuitry (not shown in FIG. 1) in the flash memory begins discharging the voltage VPP on the HVBUS which, in turn, starts discharging the array source AS and drive PWDRV. At the same time, the discharge circuitry begins discharging the voltage −VPP on the word line WL. As a result of the capacitive couplings CWP and CWA, the discharge of word line WL towards ground causes the voltages on the array source AS and p-well drive PWDRV to increase above the voltage VPP, as indicated in FIG. 2 just after the time T0. Similarly, the capacitive couplings CWP and CWA result in the discharge of the array source AS and drive PWDRV towards ground causing the voltage on the word line WL to increase below the voltage −VPP, as also indicated in FIG. 2 just after the time T0. The voltage on the word line WL going more negative than −VPP and the voltages on the array source and drive PWDRV becoming more positive than VPP results in the discharge of these voltages taking a longer time since the increased magnitudes take longer to discharge to ground.

As illustrated in FIG. 2, the array source AS and p-well drive PWDRV are initially discharged not to ground but to a verify voltage VHC, which is typically approximately 5 volts. As will be appreciated by those skilled in the art, the HVBUS is discharged to VHC so that the voltage VHC on the bus may be used during a subsequent verify operation to apply VHC on the word lines WL and access the memory cells 100 to verify each memory cell in the corresponding block was properly erased. At a time T1, the array source AS and p-well drive PWDRV are disconnected from the HVBUS bus and coupled to ground, resulting in the voltages on the array source and p-well drive discharging rapidly to ground as illustrated. This rapid discharge of the voltages on the array source AS and p-well drive PWDRV is once again coupled to the word line WL due to the capacitive couplings CWA and CWP. As seen in FIG. 2 at just after the time T2, the voltage on the word line WL dips negative to an even greater extent than before due to the rapid rate of the discharge of the array source AS and p-well drive PWDRV. Once again, this capacitive coupling results in the discharge of the word line WL taking longer since the increased magnitude takes longer to discharge to ground.

The capacitive couplings CWA and CWP can result in a total discharge time TD, which is the time to discharge the word line WL, array source AS, and p-well drive PWDRV to ground, being undesirably long. A longer discharge time TD slows the overall operation of the flash memory since after a block of memory cells 100 is erased, data cannot be read from or written to cells in the block until after the time TD. Furthermore, the capacitive coupling can also have other undesirable affects on components in the flash memory. For example, if coupling results in magnitude of the voltages on the word line WL, array source AS, or p-well drive PWDRV becoming too great, junctions in the memory-cell array could become forward biased or break down, possibly damaging or stressing such junctions and possibly leading to reliability problems or "latchup" of the flash memory, as will be appreciated by those skilled in the art. A specific example is the PN junction formed by the p-well 106 and source 102. If this PN junction was to become forward biased, which could occur when the capacitive coupling CWP between the word line WL and the p-well 106 is stronger than the coupling CWA between the word line and the array source AS, then latchup could occur.

There is a need in flash memories for a circuit and method for reducing the coupling between the negative voltage on the word line and the positive voltages on the array source and p-well drive to reduce the time required to discharge the word line, array source, and p-well drive after erasing a block of memory cells, and to prevent stressing or damaging components in the flash memory during a discharge cycle.

SUMMARY OF THE INVENTION

In one aspect of the invention, a non-volatile memory device having an array of non-volatile memory cells, an erase circuit and a discharge circuit is provided. The erase circuit is coupled to the non-volatile memory cells and configured to erase the same and the discharge circuit is coupled to the erase circuit and operable to discharge a voltage at a source of a non-volatile memory cell and a well of the memory device according to first and second phases in response to at least one of the non-volatile memory cells being erased.

In another aspect of the invention, a non-volatile memory is provided. The non-volatile memory includes a well and an array of non-volatile memory cells formed in the well. The non-volatile memory further includes an erase circuit to generate an erase voltage to be applied to the well and a source of at least one non-volatile memory cell for erasing the memory cell and a circuit to discharge voltages on the well and source. The circuit has a control circuit for generating a discharge control signal and a coupling circuit for discharging the voltages responsive to the discharge control signal in accordance with a first discharge rate during a first phase and in accordance with a second discharge rate during a second phase.

In another aspect of the invention, a method for erasing a non-volatile memory cell in a memory device is provided. The method includes driving a source node of the non-volatile memory cell and driving a well node of the memory device with an erase voltage to erase the non-volatile memory cell. The source node is then coupled to the well node, and the source node and the well node are discharged in accordance with a first discharge rate and then discharged in accordance with a second discharge rate.

In another aspect of the invention, a method for operating a non-volatile memory device is provided. The method includes erasing at least one non-volatile memory cell of the memory device and coupling a source of the non-volatile memory cell to a well in which the source is formed. Voltages on the source and the well are discharged to a first voltage level in accordance with a first rate and discharged from the first voltage level to a second level in accordance with a second rate.

DETAILED DESCRIPTION OF THE INVENTION

Figure 3:
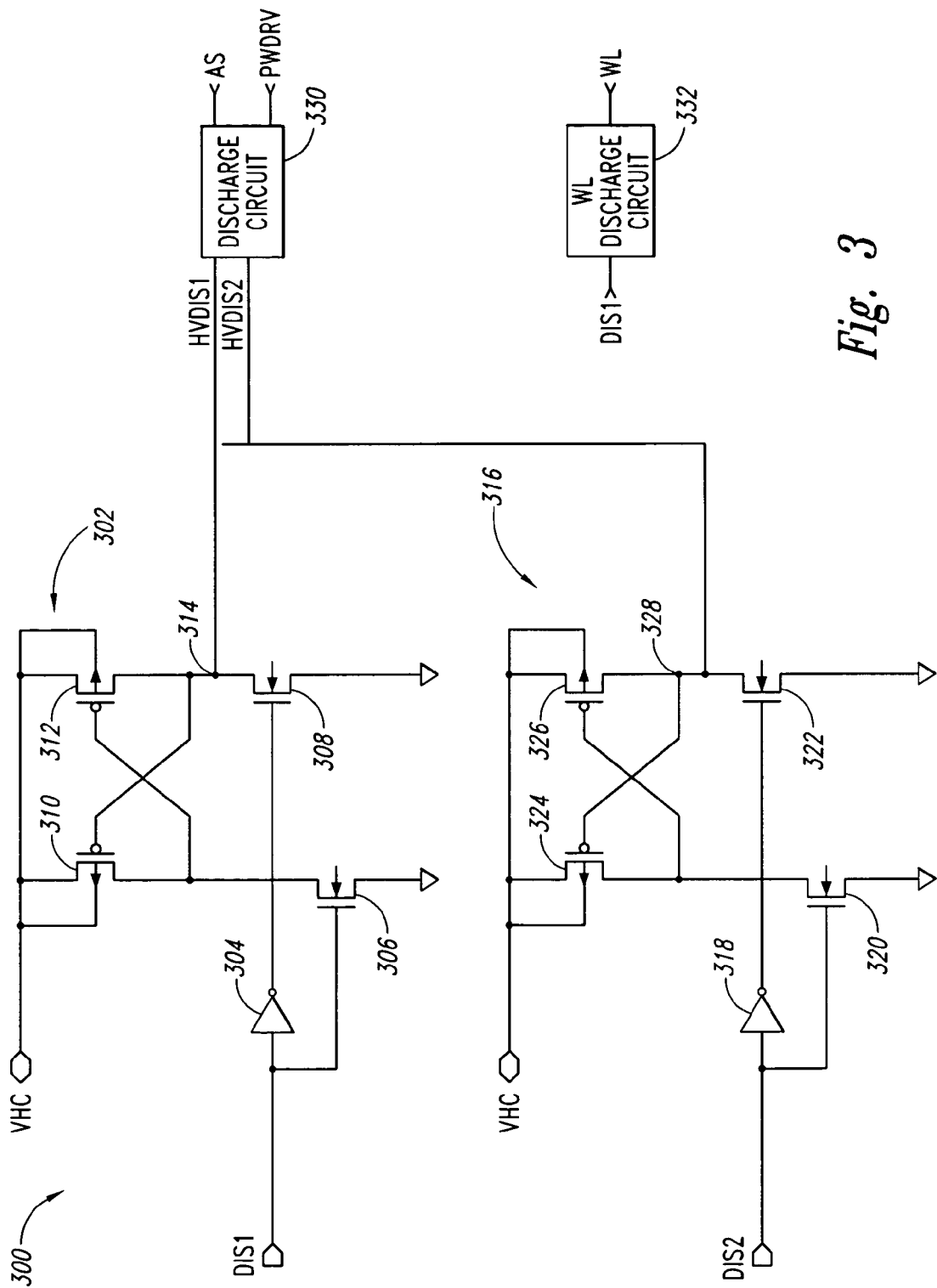
FIG. 3 is a schematic and functional block diagram illustrating a discharge controller for discharging an array source, p-well drive, and word line WL in a flash memory device according to one embodiment of the present invention.

FIG. 3 is a schematic and functional block diagram illustrating a discharge controller 300 that discharges positive programming voltages VPP developed on an array source AS and p-well drive PWDRV and a negative programming voltage –VPP developed on a word line WL in a flash memory device (not shown in FIG. 3) according to one embodiment of the present invention. After an erase cycle of the flash memory containing the discharge controller 300, the discharge controller couples the array source AS to the p-well drive PWDRV to prevent forward biasing of the PN junction formed by these two regions which, in turn, prevents damage to the flash memory that may result from such forward biasing as previously mentioned. The discharge controller 300 also controls a rate of discharge of the voltages VPP on the array source AS and p-well drive PWDRV to thereby reduce the coupling between the array source/p-well drive and the word line WL, and in this way reduces the time required to discharge the voltages on the array source, p-well drive, and word line WL to ground. The operation of the discharge controller 402 will be described in more detail below.

In the following description, certain details are set forth to provide a sufficient understanding of the present invention while ancillary circuits have not been shown in detail to avoid unnecessarily obscuring the present invention. However, it will be clear to one skilled in the art that the present invention may be practiced without these particular details. Moreover, although embodiments of the present invention are described with reference to a flash memory device, those skilled in the art will appreciate that the principles of the present invention may be applied to any type of integrated circuit containing flash memory, and may also be applied to other circuits not containing flash memory but where voltages in the circuit are being discharged.

The discharge controller 300 includes a first level-shifting circuit 302 formed by an inverter 304, two NMOS transistors 306, 308, and two PMOS transistors 310, 312 coupled as shown. The first level-shifting circuit 302 develops a high-voltage discharge signal HVDIS on a node 314 in response to a first discharge signal DIS1 applied to the inverter 304. More specifically, when the DIS1 signal goes high, the transistor 306 turns ON, pulling the gate of the transistor 312 low and thereby turning ON the transistor 312. A supply voltage VHC is applied through the turned ON transistor 312, driving the HVDIS1 signal on the node 314 high. In response to the high DIS1 signal, the inverter 304 outputs a low discharge enable signal ENDIS1 to the transistor 308, which, in turn, turns OFF. The high voltage on the node 314 also turns OFF the transistor 310. Thus, in response to the high DIS1 signal, the transistors 306 and 312 turn ON and transistors 308 and 310 turn OFF, driving the HVDIS1 signal on the node 314 high.

When the DIS1 signal goes low, the inverter 304 outputs a high ENDIS1 signal, turning ON the transistor 308 and thereby pulling the HVDIS1 signal on the node 314 low. In response to the low HVDIS1 signal on the node 314, the transistor 310 turns ON, applying approximately the VHX voltage to the gate of the transistor 312 and turning the transistor 312 OFF. The transistor 306 turns OFF in response to the low DIS1 signal. The node 314 has some capacitance, and therefore the rate at which the HVDIS1 signal goes high and the level or magnitude of the HVDIS1 signal depends on the size of the PMOS transistor 312. The rate at which the HVDIS1 signal goes low depends on the size of the NMOS transistor 308.

The discharge controller 300 further includes a second level-shifting circuit 316 that includes components 318–328 that operate in the same way as the previously corresponding components 304–314 in the first level shifting circuit 302. Thus, for the sake of brevity, the operation and connection of these components 318–328 will not again be described in detail. The second level-shifting circuit 316 develops a second high voltage discharge signal HVDIS2 on the node 328 in response to a second discharge signal DIS2. When the DIS2 signal is high and low the circuit 316 drives the HVDIS2 signal high and low, respectively, in the same way as previously described for the first level-shifting circuit 302 and the HVDIS1 signal. The rates at which the HVDIS2 signal on the node 328 goes low and high depends on the sizes of the transistors 322 and 326, respectively. Other circuitry (not shown in FIG. 3) in the flash memory containing the discharge controller 300 supplies the DIS1 and DIS2 signals, as will be discussed in more detail below.

In the discharge controller 300, the HVDIS1 and HVDIS2 signals are applied to a discharge circuit 330, which is coupled to the array source AS and p-well drive PWDRV. In response the HVDIS1 signal going high, the discharge circuit 300 operates in a first discharge mode, coupling the array source AS to the p-well drive PWDRV and beginning to discharge the voltages VPP on the array source and p-well drive towards ground at a first rate. The first rate controls the discharge of the array source AS and p-well drive PWDRV so that the coupling between these two nodes and the word line WL is reduced, as will be discussed in more detail below. In one embodiment of the discharge circuit 330, the voltages on the array source AS and p-well drive PWDRV are discharged to a threshold voltage VT, which is close to ground, during the first discharge mode of operation, as will discussed in more detail below. When the HVDIS2 signal goes high, the discharge circuit 330 commences operation in a second discharge mode, coupling the array source AS and p-well drive PWDRV to each other and directly to ground to complete the discharge of the voltages on these nodes to ground.

The discharge controller 300 further includes a conventional WL discharge circuit 332, which, in response to the high DIS1 signal, couples the word line WL to ground to discharge the voltage on the word line to ground. One skilled in the art will understand circuitry to implement the WL discharge circuit 332 and thus, for the sake of brevity, this circuit will not be described in more detail.

Figure 1A:
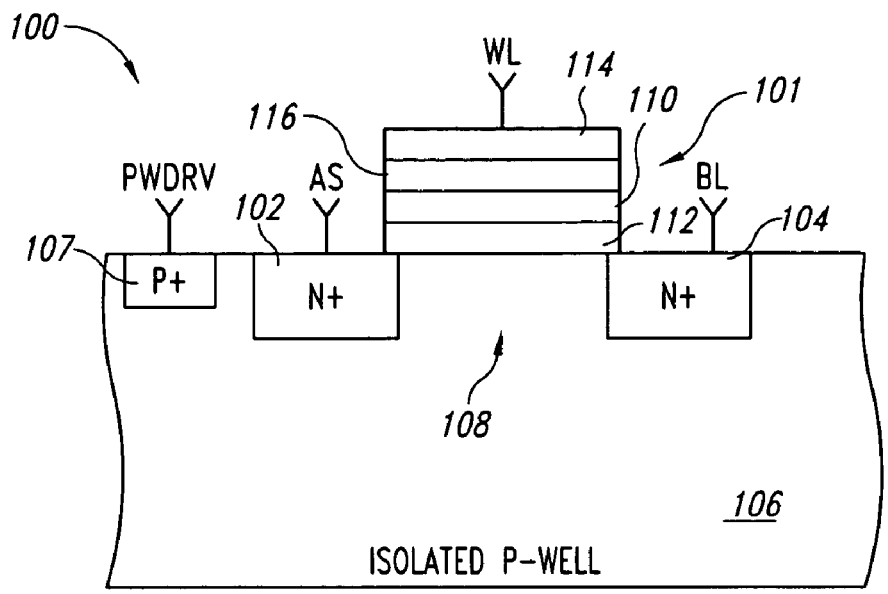
FIG. 1A–1C illustrate simplified cross-sectional views of a conventional flash memory cell and the operation of the cell during write and erase operations.
Figure 1B:
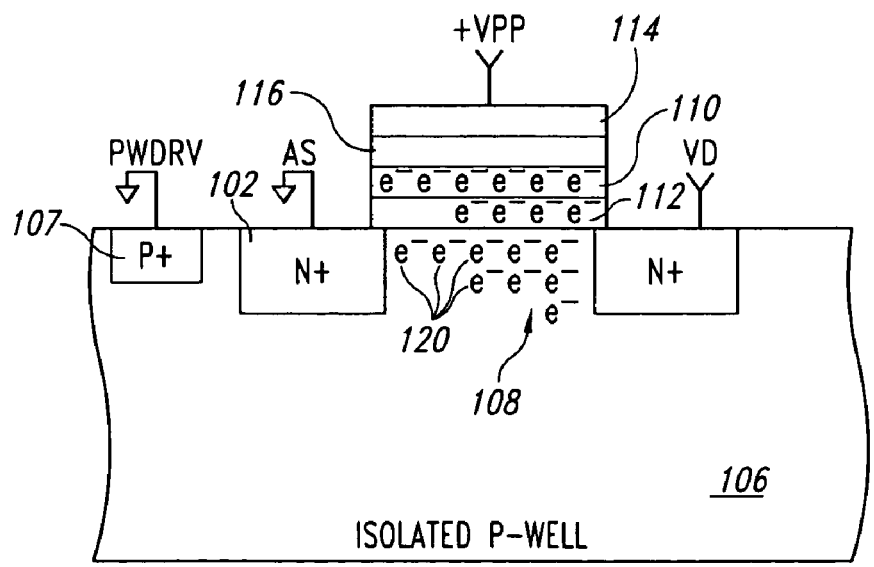
Figure 1C:
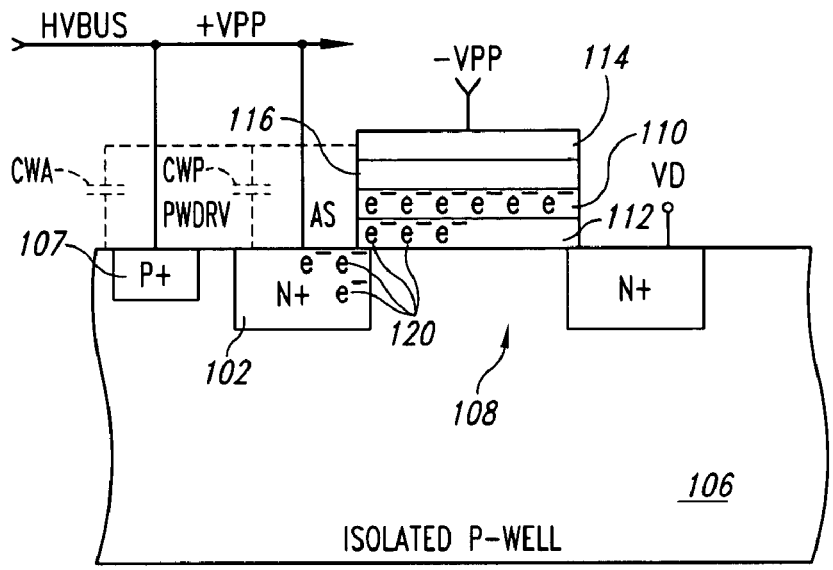
Figure 4:
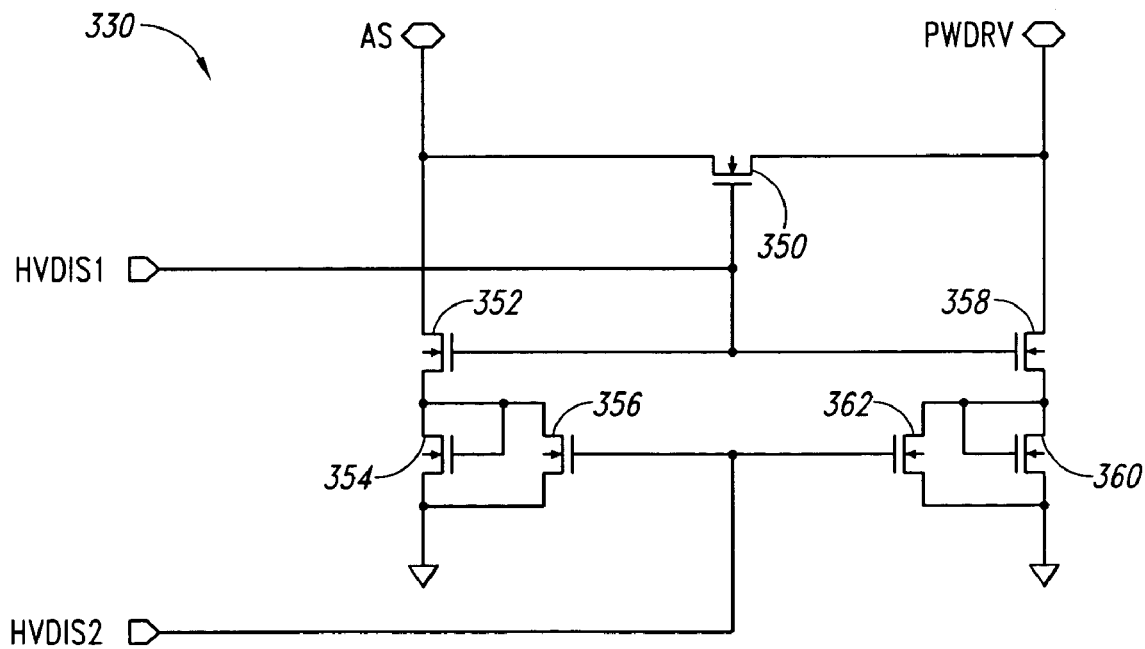
FIG. 4 illustrates one embodiment of the discharge circuit of FIG. 3.
Figure 2:
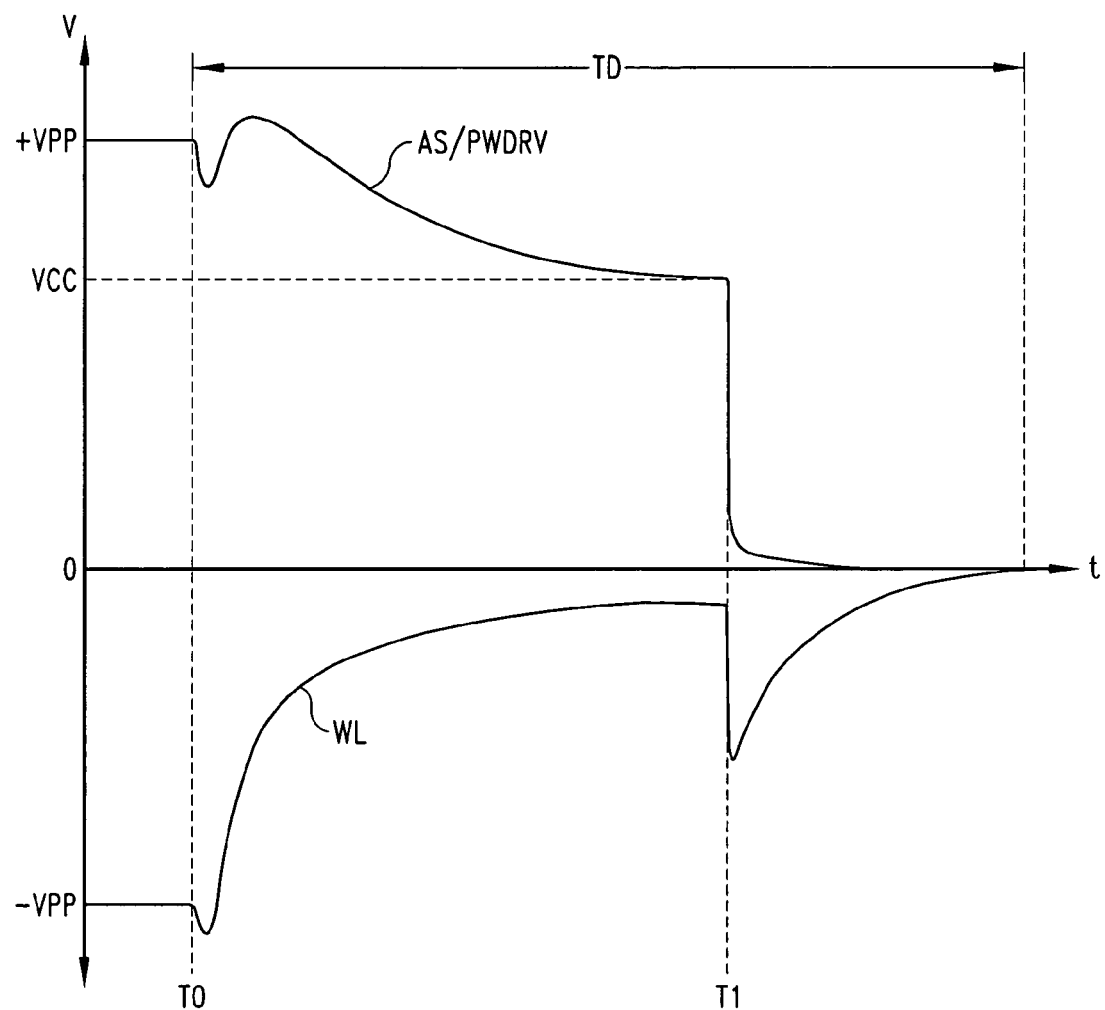
FIG. 2 illustrates a conventional discharge cycle in a flash memroy and the affect of the capacitive coupling between the word line and the array source and p-well drive nodes.

Before describing the overall operation of the discharge controller 300, one embodiment of the discharge circuit 330 will be described with reference to FIG. 4. In the embodiment of FIG. 4, the discharge circuit 330 includes an NMOS shorting transistor 350 coupled between the array source AS and p-well drive PWDRV and receiving the HVDIS1 signal. When the HVDIS1 signal goes high, the transistor 350 turns ON, coupling the array source AS to the p-well drive PWDRV which, as previously mentioned, prevents the PN junction formed by the p-well drive and array source from becoming forward biased during discharge of these two node. The discharge circuit 330 further includes a first NMOS discharge transistor 352 coupled in series with a first diode-coupled NMOS transistor 354 between the array source AS and ground. When the HVDIS1 signal is high, the discharge transistor 352 turn ON, discharging the array source AS through the diode-coupled transistor 354 to ground. The diode-coupled transistor 354 has current-voltage characteristics similar to those of conventional PN junction diode, and thus current flows from the array source AS at a first rate according to these characteristics. In this way, the transistors 352 and 354 operate in combination to control the discharge rate of the array source AS during the first discharge mode when the HVDIS1 signal is high.

A bypass NMOS discharge transistor 356 is coupled in parallel with the diode-coupled transistor 354 and receives the HVDIS2 signal. When the HVDIS2 signal is high during the second discharge mode, the transistor 356 turns ON, bypassing the diode-coupled transistor 354 and thereby coupling the array source AS directly to ground through the turned ON transistors 352 and 356. Thus, during the second discharge mode, current flows through the transistors 352 and 356 to discharge the array source AS at a second rate. The current flowing through the transistors 352 and 356 during the second discharge mode is not controlled as during the first discharge mode, and has peak value limited only by the physical characteristics of the transistors 352 and 356.

The discharge circuit 330 further includes transistors 358–362 coupled in between the p-well drive PWDRV and ground in the same way as the transistors 352–356, respectively, are coupled between the array source AS and ground.

The transistors 358–362 operate during the first and second discharge modes in the same way as previously described for the transistors 352–366 and thus, for the sake of brevity, their operation will not be described in more detail.

The overall operation of the discharge controller 300 will now be described in more detail with reference to FIGS. 3 and 4 along with FIGS. 5A–E, which are signal timing diagrams illustrating several signals in the discharge controller during a discharge cycle of operation. As shown in FIG. 5E, operation of the discharge controller 300 in the first discharge mode commences at a time T0 when the DIS1 signal goes high. In response to the DIS1 signal going high, WL discharge circuit 332 begins discharging the word line WL to ground and the first level-shifting circuit 302 begins driving the HVDIS1 signal on the node 314 high. As previously mentioned and as illustrated in FIG. 5C, the HVDIS1 signal begins increasing after the time T0, with the rate of increase being determined by the size of the PMOS transistor 312 in the first level-shifting circuit 302. As the voltage of the HVDIS1 signal increases, the shorting transistor 350 turns ON and couples the array source AS to the p-well drive PWDRV. In response to the HVDIS1 signal going high, the discharge transistors 352, 358 also turn ON and begin discharging the array source AS and p-well drive PWDRV through the diode-coupled transistors 354 and 360. As shown in FIG. 5D, the DIS2 signal is low during the first discharge mode, causing the second level-shifting circuit 316 to drive the HVDIS signal low which turns OFF the bypass transistors 356 and 362.

At this point during the first discharge mode, the voltages VPP on the array source AS and p-well drive PWDRV discharge through the diode-coupled transistors 354, 360 and the voltage on the array source and p-well drive begins decreasing as illustrated. Note the voltage –VPP on the word line WL also begins increasing towards ground at this time. The discharge of the word line WL directly to ground slightly affects the discharge of the array source AS and p-well drive PWDRV, as indicated by the level portion 370 of the discharge voltage curves for the array source and p-well drive between the time T0 and a time T1. No increase in the voltages on the array source AS and p-well drive PWDRV results from this coupling of the word line discharge. Moreover, also note the discharge of the array source AS and p-well drive PWDRV does not affect the voltage on the word line WL as in the prior art.

Figure 5A:
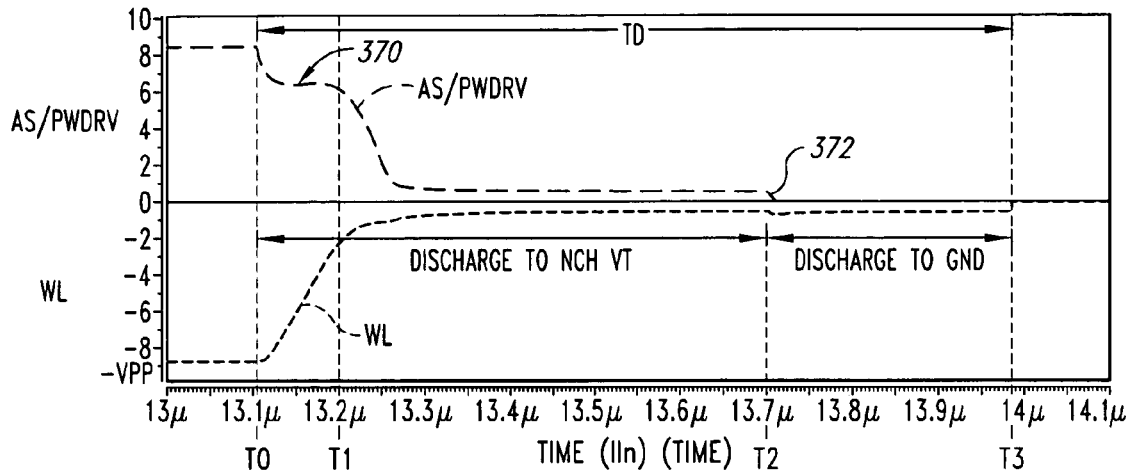
FIGS. 5A–E are signal diagrams illustrating various signals in the discharge controller of FIG. 3 during operation.
Figure 5B:
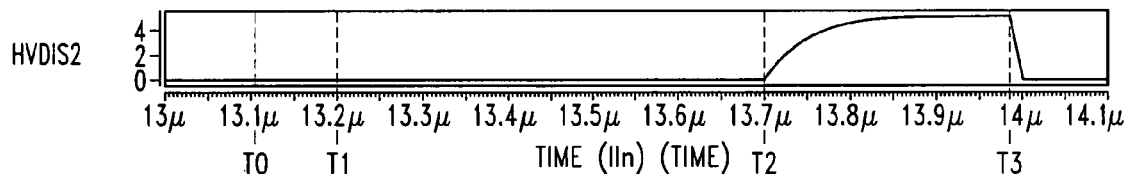
Figure 5C:
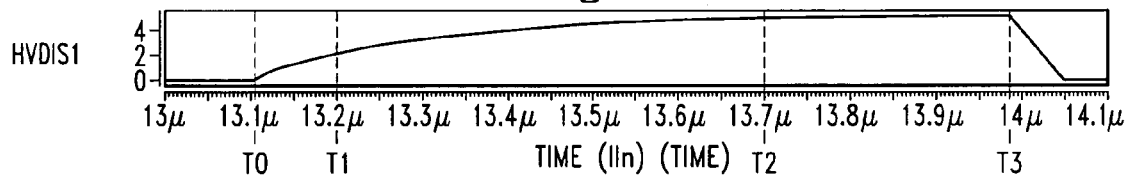
Figure 5D:
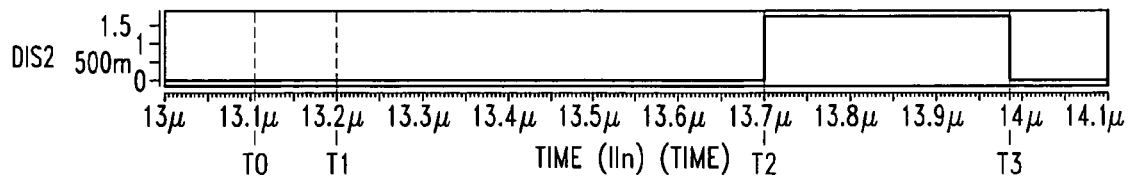
Figure 5E:
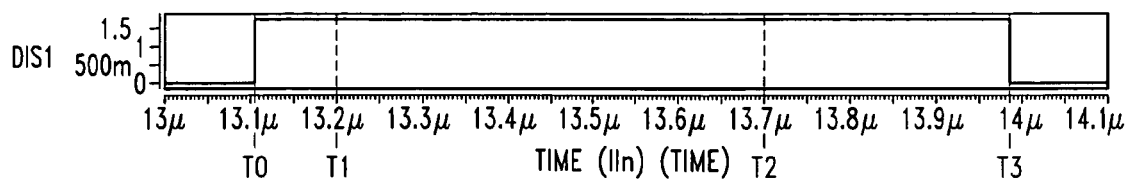

The discharge controller 300 discharges the voltages on the array source AS, p-well drive PWDRV, and word line WL to ground as illustrated in FIG. 5A after the time T0. The controller 300 operates in the first discharge mode from the time T0 until at time T2, at which point the DIS2 signal goes high to initiate the second discharge mode of operation. The DIS1 signal remains high during the second discharge mode, causing the first level-shifting circuit 302 to maintain the HVDIS 1 signal high. In response to the high DIS2 signal, the second level shifting circuit 316 drives the HVDIS2 signal high as shown in FIG. 5B after the time T2. When the HVDIS2 signal goes high, the bypass transistors 356, 362 (FIG. 4) turn ON, bypassing the diode-coupled transistors 354, 360 and discharging the array source AS and p-well drive PWDRV to ground through the transistors 352, 356 and 358, 362. The voltages on the array source AS and p-well drive PWDRV begin discharging to ground, as illustrated by the portion 372 of these voltage curves at just after the time T2.

In the discharge controller 300, the discharge of the array source AS and p-well drive PWDRV directly to ground does not affect the voltage on the word line WL as in the prior art.

This is true because the voltages on the array source AS and p-well drive PWDRV have been discharged to approximately the threshold voltages VT of the diode-coupled transistors 354, 360 before the controller 300 commences operation in the second discharge mode. This controlled discharge of the voltages on the array source AS and p-well drive PWDRV during the first discharge mode means there is no rapid discharge of relatively high voltages on the array source and p-well drive when these node were coupled directly to ground as in the prior art. No rapid discharge results in less coupling between the array source AS/p-well drive PWDRV and the word line WL, and thus the discharge voltage on the word line WL is not greatly affected by the discharge of the array source and p-well drive. As a result, the total discharge time TD of the array source AS, p-well drive PWDRV, and word line WL is reduced with the discharge controller 300. Also note from FIG. 5A that the voltages on the array source AS and p-well drive PWDRV are approximately equal due to the shorting transistor 350 (FIG. 4) coupling these two nodes together and thereby preventing any damage to the flash memory that can result from such forward biasing, as previously discussed.

With the discharge controller 300, the rate at which the array source AS and p-well drive PWDRV are discharged is a function of the rate at which the HVDIS1 signal goes high, which is a function of the size of the transistor 312 in FIG. 3. The rate at which the array source AS and p-well drive PWDRV are discharged is also a function of the current through the diode-coupled transistor 354 (FIG. 4). While the discharge rate of the array source AS and p-well drive PWDRV is controlled via the diode-coupled transistors 354, 360 (FIG. 4), one skilled in the art will appreciate that other circuits may be used in place of the diode-coupled transistors to control this discharge rate.

Figure 6:
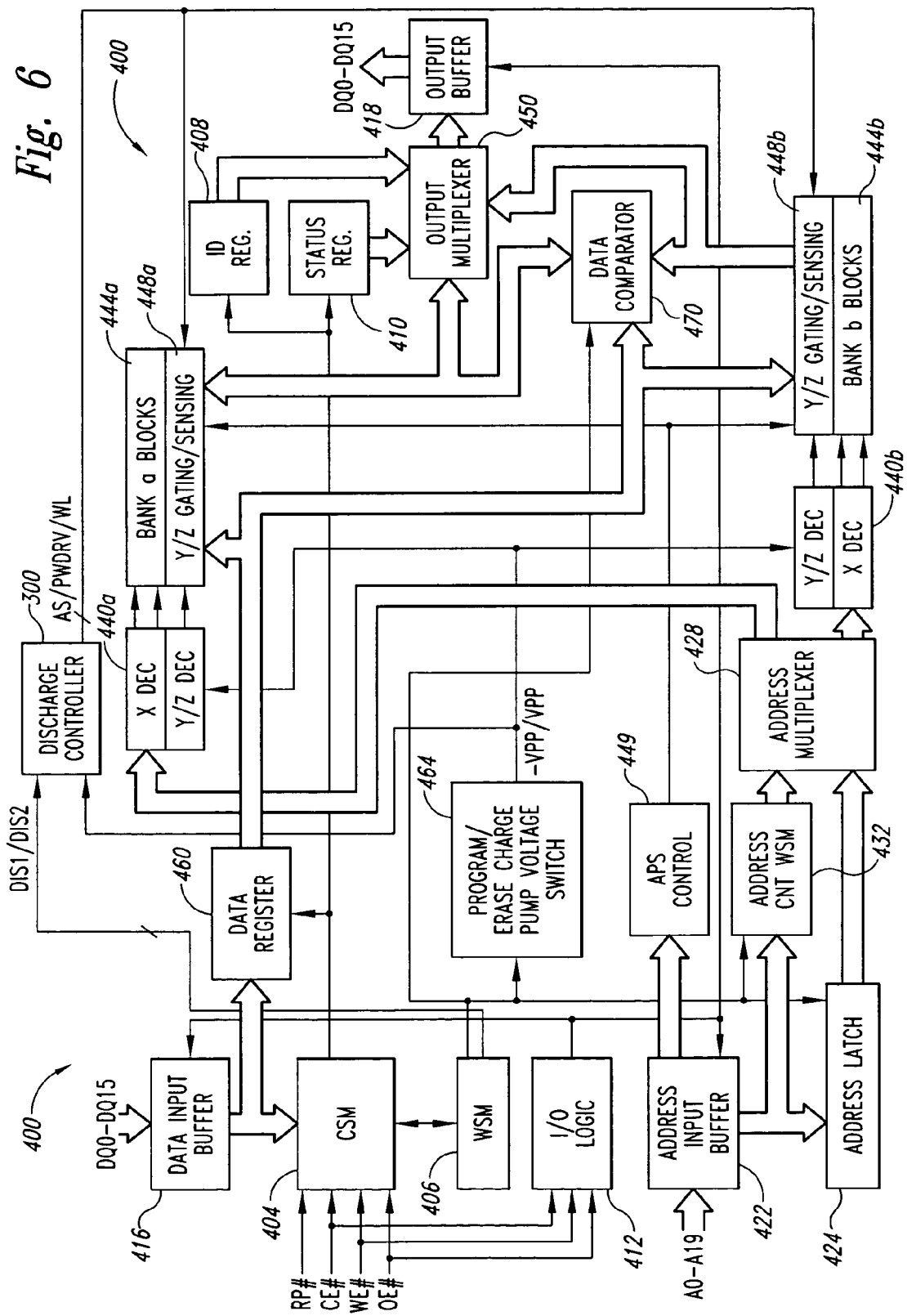
FIG. 6 is a functional block diagram of a flash memory device including the discharge controller of FIG. 3.

FIG. 6 is a functional block diagram of a flash memory 400 including the discharge controller 300 of FIG. 3. The flash memory 400 includes a command state machine (CSM) that receives commands in the form of a number of command signals, including a reset/power-down signal RP#, a chip enable signal CE#, a write enable signal WE#, and an output enable signal OE#, where the "#" denotes a signal as being low true. The commands are issued to the CSM 404 by an external processor (not shown), and the CSM functions a an interface between the external processor and an internal write state machine (WSM) 408. When a specific command is issued to the CSM 404, internal command signals are provided to the WSM 408, which in turn, executes the appropriate algorithm to generate the necessary timing signals to control the memory device 400 internally, and accomplish the requested operation. The WSM 408 applies the DIS1 and DIS2 signals to the discharge controller 300 in response to the processor applying an erase command to the flash memory 400. The CSM 404 also provides the internal command signals to an ID register 408 and a status register 410, which allows the progress of various operations to be monitored when interrogated by issuing to the CSM 404 the appropriate command.

Portions of the commands are also provided to input/output (I/O) logic 412 which, in response to a read or write command, enables a data input buffer 416 and an output buffer 418, respectively. The I/O logic 412 also provides signals to an address input buffer 422 in order for address signals to be latched by an address latch 424. The latched address signals are in turn provided by the address latch 424 to an address multiplexer 428 under the command of the WSM 406. The address multiplexer 428 selects between the address signals provided by the address latch 424 and those provided by an address counter 432. The address signals provided by the address multiplexer 428 are used by an address decoder 440 to access the memory cells of memory banks 444a, 444b that correspond to the address signals. A gating/sensing circuit 448a, 448b is coupled to each memory bank 444a, 444b for the purpose of programming and erase operations, as well as for read operations. Each gating/sensing circuit 448a, 448b also couples the array source AS, p-well drive PWDRV, and word lines WL for blocks of memory cells in the banks 444a, 444b to the discharge controller 300.

During a read operation, data is sensed by the gating/sensing circuit 448 and amplified to sufficient voltage levels before being provided to an output multiplexer 450. The read operation is completed when the WSM 406 instructs an output buffer 418 to latch data provided from the output multiplexer 450 to be provided to the external processor. The output multiplexer 450 can also select data from the ID and status registers 408, 410 to be provided to the output buffer 418 when instructed to do so by the WSM 406. During a program or erase operation, the I/O logic 412 commands the data input buffer 416 to provide the data signals to a data register 460 to be latched. The WSM 406 also issues commands to program/erase circuitry 464 which uses the address decoder 440 to carry out the process of injecting or removing electrons from the memory cells of the memory banks 444a, 444b to store the data provided by the data register 460 to the gating sensing circuit 448. The program/erase circuitry 464 also provides the erase voltages VPP and −VPP to the discharge controller 300. The discharge controller 300 operates as previously described in response to the DIS1 and DIS2 signals from the WSM 406 to discharge the array source AS, p-well drive, PWDRV, and word lines WL in a selected block of memory cells in the memory banks 444a, 444b. To ensure that sufficient programming or erasing has been performed, a data comparator 470 is instructed by the WSM 406 to compare or verify the state of the programmed or erased memory cells to the data latched by the data register 460.

It will be appreciated that the embodiment of the flash 400 that is illustrated in FIG. 6 has been provided by way of example and that the present invention is not limited thereto. Those of ordinary skill in the art have sufficient understanding to modify the previously described memory device embodiment to implement embodiments of the discharge controller. For example, although the discharge controller 300 is represented in FIG. 6 as a separate circuit block, the controller may be incorporated into one of the other circuit blocks, or alternatively, may be split among several circuit blocks. The particular arrangement of the discharge controller 300 within a memory device will be a matter of design preference.

Figure 7:
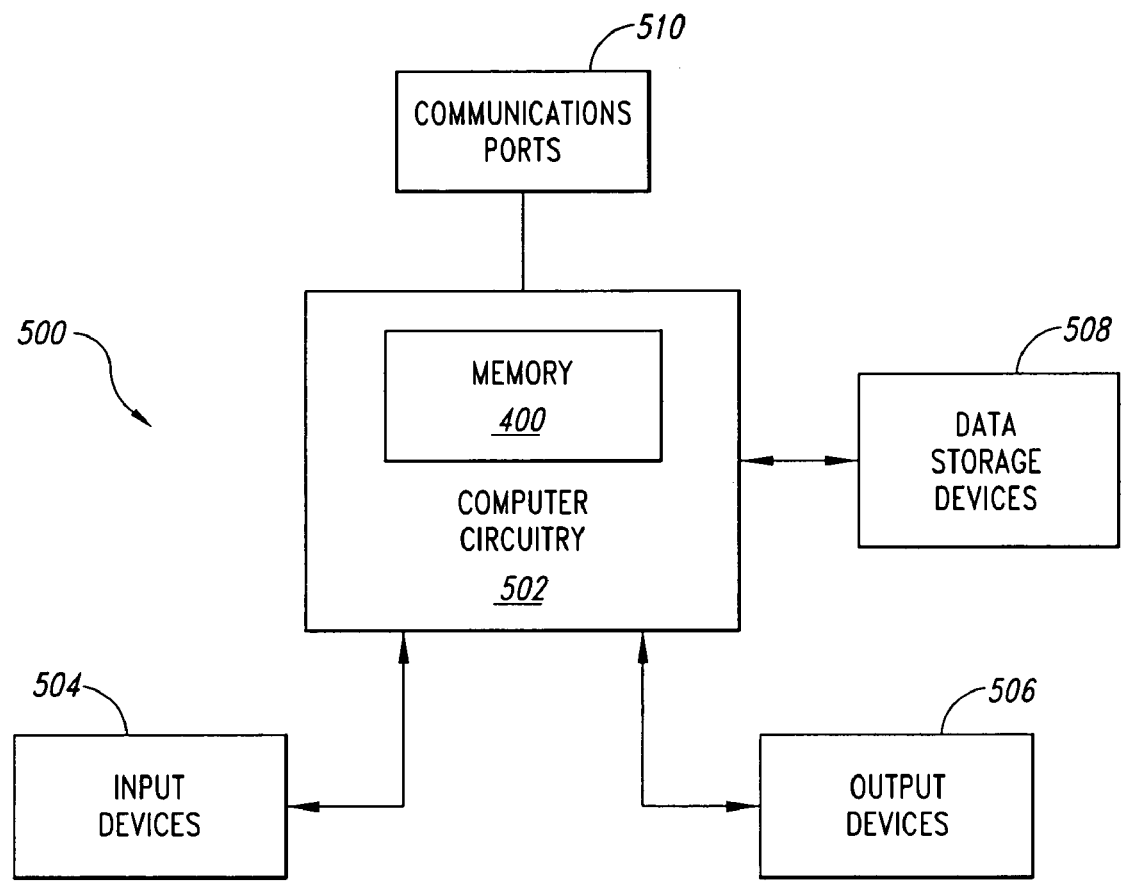
FIG. 7 is a functional block diagram of a computer system including the flash memory of FIG. 6.

FIG. 7 is a block diagram of a computer system 500 including computer circuitry 502 that contains the flash memory 400 of FIG. 6. The computer circuitry 502 performs various computing functions, such as executing specific software to perform specific calculations or tasks. In addition, the computer system 500 includes one or more input devices 504, such as a keyboard or a mouse, coupled to the computer circuitry 502 to allow an operator to interface with the computer system. Typically, the computer system 500 also includes one or more output devices 506 coupled to the computer circuitry 502, such output devices typically being a printer or video display. One or more data storage devices 508 are also typically coupled to the computer circuitry 502 to store data or retrieve data from external storage media (not shown). Examples of typical storage devices 508 include hard and floppy disks, tape cassettes, compact disc read-only memories (CD-ROMs), read-write CD ROMS (CD-RW), and digital video discs (DVDs). The computer system 510 also typically includes communications ports 510 such as a universal serial bus (USB) and/or an IEEE-1394 bus to provide for communications with other devices, such as desktop personal computers, a digital cameras, and digital camcorders. The computer circuitry 502 is typically coupled to the flash memory 400 through appropriate address, data, and control busses to provide for writing data to and reading data from the flash memory.

Even though various embodiments and advantages of the present invention have been set forth in the foregoing description, the above disclosure is illustrative only, and changes may be made in detail and yet remain within the broad aspects of the invention. Therefore, the present invention is to be limited only by the appended claims.

The invention claimed is:

1. A non-volatile memory device, comprising:
an array of non-volatile memory cells;
an erase circuit coupled to the non-volatile memory cells and configured to erase the same; and
a coupling circuit coupled to the erase circuit and the array of non-volatile memory cells and operable to eciuilibrate a voltage of a source of a non-volatile memory cell and a well of the memory device, the coupling circuit further operable to discharge the voltage at the source and the well in accordance with a first discharge rate during a first phase and in accordance with a second discharge rate during a second phase, the coupling circuit including first and second diode circuits coupled to ground, first and second transistors operable to couple the source of the non-volatile memory cell to the first diode circuit and couple the well of the memory device to the second diode circuit during the first phase, a third transistor operable to couple the source to the well during the first phase, and fourth and fifth transistors operable to couple the source and the well to ground during the second phase.

2. The non-volatile memory device of claim 1 wherein the first and second diode circuit comprise first and second diode coupled transistors.

3. The non-volatile memory device of claim 1 wherein the control circuit comprises:
a first circuit operable to generate a first control signal during the first phase for the coupling circuit to increase coupling of the source to the well and coupling of the source to the first diode circuit and the well to the second diode circuit over a time period; and
a second circuit operable to generate a second control signal during the second phase for coupling the source and well to ground.

4. The non-volatile memory of claim 3 wherein the first circuit comprises a level shifting circuit having at least one transistor, the first circuit operable to generate the first control signal in accordance with electrical characteristics of the transistor.

5. The non-volatile memory device of claim 1 wherein the coupling circuit is operable to discharge the voltage at the source and the well at a controlled rate in the first phase and at an uncontrolled rate in the second phase.

6. A non-volatile memory, comprising:
a well;
an array of non-volatile memory cells formed in the well;
an erase circuit coupled to the well and the non-volatile memory cells, the erase circuit operable to generate an erase voltage to be applied to the well and a source of at least one non-volatile memory cell for erasing the memory cell; and
a circuit operable to discharge voltages on the well and the source, the circuit having a control circuit operable to generate a discharge control signal and a coupling circuit operable to couple the well and the source responsive to the discharge control signal the circuit further having first and second diode circuits coupled to ground, first and second transistors operable to couple the source of the non-volatile memory cell to the first diode circuit and couple the well to the second diode circuit during a first phase to discharge the voltages in accordance with a first discharge rate, and third and fourth transistors operable to couple the source and the well to ground during a second phase to discharge the voltages in accordance with a second discharge rate.

7. The non-volatile memory of claim 6 wherein the first and second diode circuits comprise first and second diode coupled transistors.

8. The non-volatile memory of claim 6 wherein the control circuit comprises:
a first circuit operable to generate a first control signal during the first phase for the coupling circuit to increase coupling of the source to the well and coupling of the source to the first diode circuit and the well to the second diode circuit over a time period; and
a second circuit operable to generate a second control signal during the second phase for coupling the source and well to ground.

9. The non-volatile memory of claim 8 wherein the first circuit comprises a level shifting circuit having at least one transistor, the first circuit operable to generate the first control signal in accordance with electrical characteristics of the transistor.

10. The non-volatile memory of claim 6 wherein the circuit is operable to discharge the voltage at the source and the well at a controlled rate in the first phase and at an uncontrolled rate in the second phase.

11. A method for erasing a non-volatile memory cell in a memory device, the method comprising:
driving a source node of the non-volatile memory cell and driving a well node of the memory device with an erase voltage to erase the non-volatile memory cell;
increasingly coupling the source node to the well node over a time period;
discharging the source node and the well node in accordance with a first discharge rate; and
discharging the source node and the well node in accordance with a second discharge rate.

12. The method of claim 11 wherein discharging the source node and the well node in accordance with a first discharge rate comprises discharging the source node and the well node in accordance with a discharge rate defined by current-voltage characteristics of a diode-coupled MOS transistor.

13. The method of claim 11 wherein discharging the source node and the well node in accordance with a second discharge rate comprises coupling the source node and the well node to a ground node.

14. The method of claim 11 wherein discharging the source node and the well node in accordance with a first discharge rate comprises increasingly coupling the source node and the well node to ground over a time period.

15. The method of claim 11, further comprising discharging a second erase voltage on a gate of the non-volatile memory cell to substantially ground.

16. A method for operating a non-volatile memory device, comprising:

erasing at least one non-volatile memory cell of the memory device;

coupling a source of the non-volatile memory cell to a well in which the source is formed;

discharging voltages on the source and the well to a first voltage level in accordance with a first discharge rate defined by current-voltage characteristics of a diode-coupled MOS transistor; and discharging the source and the well from the first voltage level to a second level in accordance with a second rate.

17. The method of claim 16 wherein discharging the source and the well in accordance with a second rate comprises coupling the source and the well to a ground node.

18. The method of claim 16 wherein coupling the source to the well comprises increasingly coupling the source to the well over a time period.

19. The method of claim 16 wherein discharging the source and the well in accordance with a first rate comprises increasingly coupling the source and the well to ground over a time period.

20. The method of claim 16, further comprising discharging a negative voltage on a gate of the non-volatile memory cell to substantially ground.

* * * * *